(12) United States Patent
Coon et al.

(10) Patent No.: US 6,847,431 B2
(45) Date of Patent: Jan. 25, 2005

(54) METHOD AND DEVICE FOR CONTROLLING FLUID FLOW IN AN OPTICAL ASSEMBLY

(75) Inventors: Derek Coon, Redwood City, CA (US); Bernard Fay, Sarasota, FL (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 10/384,969

(22) Filed: Mar. 10, 2003

(65) Prior Publication Data

US 2004/0179174 A1 Sep. 16, 2004

(51) Int. Cl.[7] .......................... G03B 27/52; G03B 27/42
(52) U.S. Cl. ........................ 355/30; 355/53; 359/509
(58) Field of Search ................... 355/30, 53; 359/509

(56) References Cited

U.S. PATENT DOCUMENTS

| | | | |
|---|---|---|---|
| 4,616,908 A | | 10/1986 | King |
| 4,690,528 A | * | 9/1987 | Tanimoto et al. ............ 353/101 |
| 5,425,045 A | * | 6/1995 | Hamatani ..................... 372/101 |
| 6,288,769 B1 | * | 9/2001 | Akagawa et al. .............. 355/30 |
| 6,362,926 B1 | | 3/2002 | Omura et al. |
| 6,630,985 B2 | * | 10/2003 | Hase ............................. 355/30 |
| 2001/0019400 A1 | | 9/2001 | Hagiwara et al. |
| 2001/0026354 A1 | | 10/2001 | Aoki |

FOREIGN PATENT DOCUMENTS

| | | |
|---|---|---|
| EP | 1063551 A1 | 12/2000 |
| EP | 1098225 A2 | 5/2001 |
| EP | 1160627 A2 | 12/2001 |
| JP | 2000-021745 | 1/2000 |
| JP | 2001168027 A2 | 3/2001 |
| JP | 2001/176770 A2001 | 6/2001 |
| JP | 2001210587 A2 | 8/2001 |

OTHER PUBLICATIONS

N. Shirashi et al. "Progress of Nikon's F2 Exposure Tool Development." Paper 4691–59 published in SPIE Proceedings vol. 4691.

H. Nogawa et al. "System design of a 157 nm scanner." Paper 4691–60, published in SPIE Proceedings vol. 4691.

Thomas J. Fahey, James A. McClay, Matthew E. Hansen, Bruce A. Tirri, Matthew Lopson, "SVG 157–nm lithography technical review." Proc. SPIE vol. 4346, p. 72–80, Optical Microlithography XIV, Christopher J. Progler Ed., Published Sep. 2001.

Naomasa Shiraishi, Soichi Owa, Yasuhiro Ohmura, Takashi Aoki, Yukako Matsumoto, Masato Hatasawa, Takashi Mori, Issei Tanaka, "Current status of Nikon's F2 exposure tool development." Proc. SPIE vol. 4346, p. 81–88, Optical Microlithography XIV, Christopher J. Progler Ed., Published Sep. 2001.

(List continued on next page.)

*Primary Examiner*—Alan Mathews
(74) *Attorney, Agent, or Firm*—Steven G. Roeder; Jim Rose

(57) ABSTRACT

An optical assembly (222) for directing and/or focusing a beam of light energy for an exposure apparatus (10) includes an optical housing (240) and one or more optical elements (242) that cooperate to form an optical cavity (270) having one or more stagnant flow areas (272). The optical assembly (222) also includes one or more flow diverters (246) for improving the flow a replacement fluid (250) in the stagnant flow areas (272) of the optical cavity (270) during purging of the optical assembly (222) with the replacement fluid (250).

38 Claims, 10 Drawing Sheets

OTHER PUBLICATIONS

Yasuaki Fukuda, Seiji Takeuchi, Takashi Aoki, Soichi Owa, Fumika Yoshida, Youichi Kawasa, Akira Sumitani, Keiji Egawa, Takehito Watanabe, Kiyoharu Nakao, "Present status of development of gas–purging and chemically clean technologies at ASET." Proc. SPIE vol. 4346, p. 659–668, Optical Microlithography XIV, Christopher J. Progler Ed., Published Sep. 2001.

Stefan Hien, Steve Angood, Dominic Ashworth, Steve Basset, Theodore M. Bloomstein, Kim R. Dean, Roderick R. Kunz, Daniel A. Miller, Shashikant Patel, Georgia K. Rich, "Photoresist outgassing at 157 nm exposure." Proc. SPIE vol. 4346, p. 439–447, Advances in Resist Technology and Processing XVIII, Francis M. Houlihan Ed. Published Aug. 2001.

* cited by examiner

US 6,847,431 B2

METHOD AND DEVICE FOR CONTROLLING FLUID FLOW IN AN OPTICAL ASSEMBLY

FIELD OF THE INVENTION

The present invention is directed to an optical assembly for an exposure apparatus. More specifically, the present invention is directed to an optical assembly that can be efficiently purged and a method for efficiently purging an optical assembly.

BACKGROUND

Exposure apparatuses are commonly used to transfer an image from a reticle onto a semiconductor wafer. A typical exposure apparatus includes an apparatus frame, an illumination source, a reticle stage, a wafer stage, and an optical assembly that cooperate to transfer an image of an integrated circuit from the reticle onto the semiconductor wafer. The illumination source generates a beam of light energy that passes through the reticle. The optical assembly directs and/or focuses the light passing through the reticle to the wafer.

The sizes of the integrated circuits transferred onto the wafer are extremely small. Accordingly, precise directing and/or focusing of the beam of light energy by the optical assembly is critical to the manufacture of high-density semiconductor wafers.

A typical optical assembly includes a tubular shaped housing and two or more spaced apart optical elements that are secured to the optical housing. Unfortunately, depending upon the wavelength of light energy generated by the illumination source, the type of fluid in the light path, including between the optical elements, can greatly influence the performance of the exposure apparatus. Typically, optical assemblies have air between the optical elements. Air is a gaseous mixture that is approximately twenty-one percent oxygen. Some wavelengths of light energy are absorbed by oxygen. Air also includes water vapor, carbon dioxide and other hydrocarbons, which also absorb significant amounts of the light energy within certain wavelength ranges. Even trace amounts of these unwanted fluids, i.e. ten parts per million or less, can result in significant absorption of the light energy. Absorption of the light energy can lead to losses of intensity and uniformity of the light energy. Moreover, absorption of the light energy can lead to localized heating within the optical assembly. Thus, air within the optical assembly can adversely influence the performance and accuracy of the exposure apparatus. As a consequence, the quality of the integrated circuits formed on the wafer can be adversely influenced.

One solution includes sealing the optical elements to the optical housing to form a sealed optical cavity, and replacing the air in the optical cavity with a weakly absorbing, replacement fluid. The replacement process can include directing the replacement fluid into an inlet of the optical cavity while allowing the air to be pushed from an outlet of the optical cavity. This process is continued until the amount of air in the optical cavity is reduced to an acceptable level.

Unfortunately, the sealed optical cavity can include one or more stagnant flow areas that are not readily purged. Stagnant flow areas experience relatively low or non-existent fluid flow during the normal purging process. These stagnant flow areas are particularly problematic if located in the light path. As a result thereof, a relatively large amount of time and replacement fluid is required to purge the optical cavity.

In light of the above, there is a need for an optical assembly that is purged of any unwanted fluid relatively easily and efficiently. Moreover, there is a need for an optical assembly that minimizes the amount of time required to dilute the unwanted fluid and the amount of replacement fluid used to dilute the unwanted fluid in the optical assembly to acceptable levels. Additionally, there is a need for an exposure apparatus that is capable of generating high-resolution patterns on a semiconductor wafer.

SUMMARY

The present invention is directed to an optical assembly for directing and/or focusing a beam of light energy. The optical assembly includes an optical housing and one or more optical elements that cooperate to define an optical cavity that includes one or more stagnant flow areas. Additionally, the optical assembly includes an outlet port, an inlet port, and a flow diverter for purging the optical chamber. A fluid source directs a replacement fluid into the optical cavity through the inlet port and out the outlet port.

The flow diverter diverts and redirects the flow of the replacement fluid in the optical cavity so that at least a portion of the replacement fluid is directed into the stagnant flow areas in the optical cavity. This improves the flow of the replacement fluid in the stagnant flow areas, improves mixing of the fluids, minimizes the time needed to purge the optical assembly and the amount of replacement fluid used to dilute the unwanted fluid in the optical cavity to acceptable levels.

In one embodiment, the optical assembly includes a plurality of flow diverters that are positioned at various strategic locations around the optical housing to increate flow velocities in the stagnant flow areas and fluid mixing within the optical cavity. For example, one of the flow diverters can be positioned near each stagnant flow area. In another embodiment, one of the flow diverters can be positioned near each stagnant flow area located in the light path.

The flow diverters assist in creating and controlling the flow patterns of the replacement fluid in the optical cavity. Further, the flow diverters increase fluid flow in the stagnant flow areas. For example, flow diverters can be positioned near each optical element to exhaust the unwanted fluid in the tight spaces near each optical element. In one embodiment, the flow diverter is positioned outside the optical path but in the fluid flow path. The flow diverters reduce the amount of trapped fluids and reduce the amount of dilution time required to replace the unwanted fluid with the replacement fluid.

In one embodiment, the flow diverter is a vane. In another embodiment, the flow diverter is a fan. The fan can be turned off and on at certain times so that possible vibration from the fan does not adversely influence optical performance. In another embodiment, the flow diverter is an integral part of an element mount that retains the optical element to the optical housing.

The present invention is also directed to an optical assembly, an exposure apparatus, a device and semiconductor wafer. Moreover, the present invention is also directed to a method for making an optical assembly, an exposure apparatus, a device, and a semiconductor wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
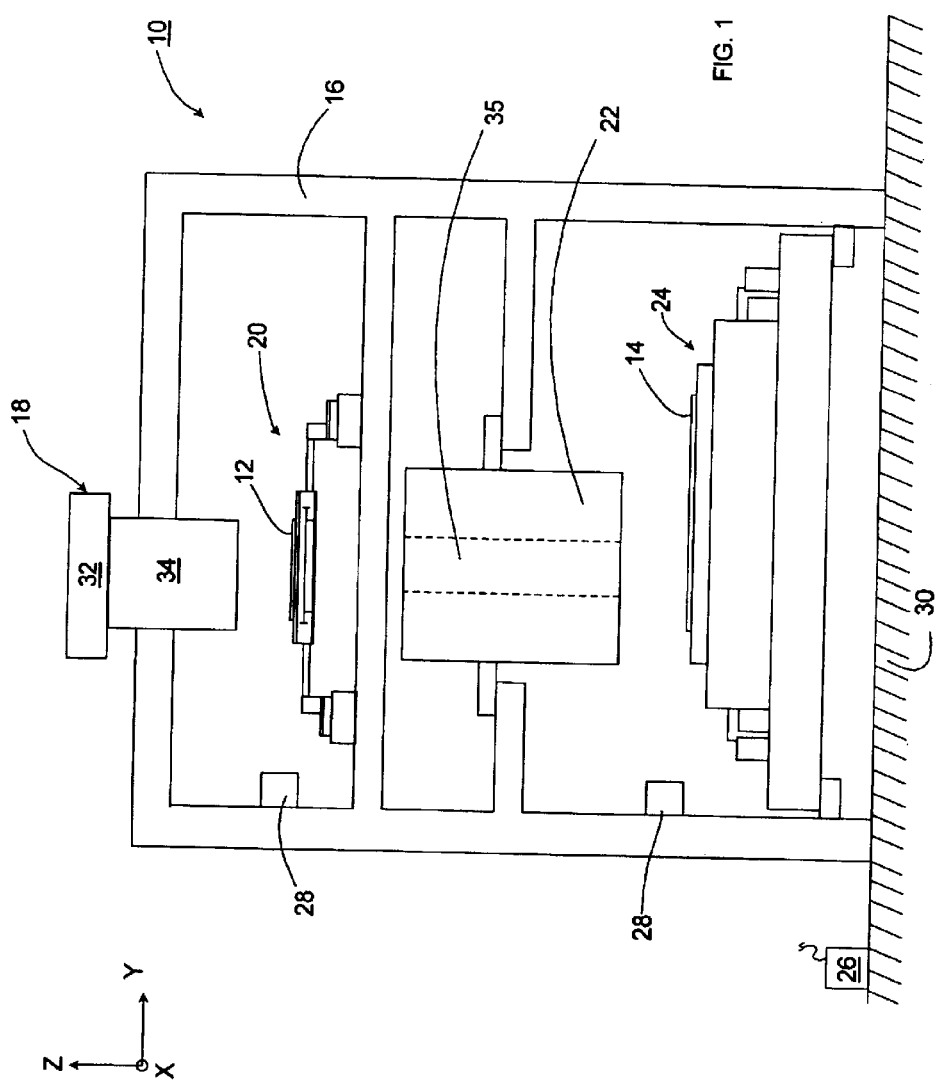
FIG. 1 is a schematic view of an exposure apparatus having features of the present invention.

FIG. 1 is a schematic view that illustrates a precision assembly, namely an exposure apparatus 10. The exposure apparatus 10 is particularly useful as a lithographic device that transfers a pattern (not shown) of an integrated circuit from a reticle 12 onto a device, such as a semiconductor wafer 14. In FIG. 1, the exposure apparatus 10 includes an apparatus frame 16, an illumination system 18 (irradiation apparatus), a reticle stage assembly 20, an optical assembly 22 (lens assembly), a wafer stage assembly 24, a control system 26, and a measurement system 28. The exposure apparatus 10 mounts to a mounting base 30, e.g., the ground, a base, or floor or some other supporting structure. The design of the components of the exposure apparatus 10 can be varied to suit the design requirements of the exposure apparatus 10.

As provided in detail below, the optical assembly 22 is designed so that the optical assembly 22 can be purged relatively efficiently.

A number of Figures include an orientation system that illustrates an X axis, a Y axis that is orthogonal to the X axis and a Z axis that is orthogonal to both X and Y axes. It should be noted that these axes can also be referred to as the first, second and third axes.

There are a number of different types of lithographic devices. For example, the exposure apparatus 10 can be used as scanning type photolithography system that exposes the pattern from the reticle 12 onto the wafer 14 with the reticle 12 and the wafer 14 moving synchronously. In a scanning type lithographic device, the reticle 12 is moved perpendicular to an optical axis of the optical assembly 22 by the reticle stage assembly 20 and the wafer 14 is moved perpendicularly to the optical axis of the optical assembly 22 by the wafer stage assembly 24. Scanning of the reticle 12 and the wafer 14 occurs while the reticle 12 and the wafer 14 are moving synchronously.

Alternatively, the exposure apparatus 10 can be a step-and-repeat type photolithography system that exposes the reticle 12 while the reticle 12 and the wafer 14 are stationary. In the step and repeat process, the wafer 14 is in a constant position relative to the reticle 12 and the optical assembly 22 during the exposure of an individual field. Subsequently, between consecutive exposure steps, the wafer 14 is consecutively moved with the wafer stage assembly 24 perpendicular to the optical axis of the optical assembly 22 so that the next field of the wafer 14 is brought into position relative to the optical assembly 22 and the reticle 12 for exposure. Following this process, the images on the reticle 12 are sequentially exposed onto the fields of the wafer 14 so that the next field of the wafer 14 is brought into position relative to the optical assembly 22 and the reticle 12.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern from a mask to a substrate with the mask located close to the substrate, without the use of a lens assembly.

The apparatus frame 16 is rigid and supports the components of the exposure apparatus 10. The apparatus frame 16 illustrated in FIG. 1 supports the optical assembly 22, the illumination system 18, and the stage assemblies 20, 24 above the mounting base 30.

The illumination system 18 includes an illumination source 32 and an illumination optical assembly 34. The illumination source 32 emits a beam (irradiation) of light energy. The illumination optical assembly 34 guides the beam of light energy from the illumination source 32 to the optical assembly 22. The beam selectively illuminates different portions of the reticle 12 and exposes the semiconductor wafer 14. In FIG. 1, the illumination source 32 is illustrated as being supported above the reticle stage assembly 20. Typically, however, the illumination source 32 is secured to one of the sides of the apparatus frame 16 and the energy beam from the illumination source 32 is directed to the reticle 12 with the illumination optical assembly 34.

The illumination source 32 can be a g-line source having a wavelength of approximately 436 nm, an i-line source having a wavelength of approximately 365 nm, a KrF excimer laser having a wavelength of approximately 248 nm, an ArF excimer laser having a wavelength of approximately 193 nm or a $F_2$ laser having a wavelength of approximately 157 nm. Alternatively, the illumination source 32 can generate charged particle beams such as an x-ray or electron beam. For instance, in the case where an electron beam is generated, thermionic emission type lanthanum hexaboride ($LaB_6$) or tantalum (Ta) can be used as the cathode for an electron gun. Furthermore, in the case where an electron beam is generated, the structure could be such that either a mask is used or a pattern can be directly formed on a substrate without the use of a mask.

The optical assembly 22 projects and/or focuses the light passing through the reticle 12 to the wafer 14. In FIG. 1, dashed lines 35 illustrate a representative example of the optical path that may be occupied by the light passing through the optical assembly 22.

When far ultra-violet rays such as the excimer laser is utilized, glass materials such as quartz and fluorite that transmit far ultra-violet rays can be used in the optical assembly 22. When the $F_2$ type laser or x-ray is utilized, the optical assembly 22 can be either catadioptric or refractive, and when an electron beam is utilized, electron optics can consist of electron lenses and deflectors.

Also, with an exposure device that employs vacuum ultra-violet radiation (VUV) of wavelength 200 nm or shorter, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. patent application No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

The reticle stage assembly 20 holds and positions the reticle 12 relative to the optical assembly 22 and the wafer 14. Similarly, the wafer stage assembly 24 holds and positions the wafer 14 with respect to the projected image of the illuminated portions of the reticle 12 in the operational position 34. The wafer stage assembly 24 is described in more detail below.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,100 and 5,874,820 and Japanese Patent Application Disclosure No. 8-330224 are incorporated herein by reference.

The control system 26 receives information from the measurement system 28 and controls the stage mover assemblies 20, 24 to precisely position the reticle 12 and the wafer 14.

The measurement system 28 monitors movement of the reticle 12 and the wafer 14 relative to the optical assembly 22 or some other reference. With this information, the control system 26 can control the reticle stage assembly 20 to precisely position the reticle 12 and the wafer stage assembly 24 to precisely position the wafer 14. For example, the measurement system 28 can utilize multiple laser interferometers, encoders, and/or other measuring devices.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a comprehensive adjustment is performed to make sure that accuracy is maintained in the complete photolithography system. Additionally, it is desirable to manufacture an exposure system in a clean room where the temperature and cleanliness are controlled.

Figure 2A:
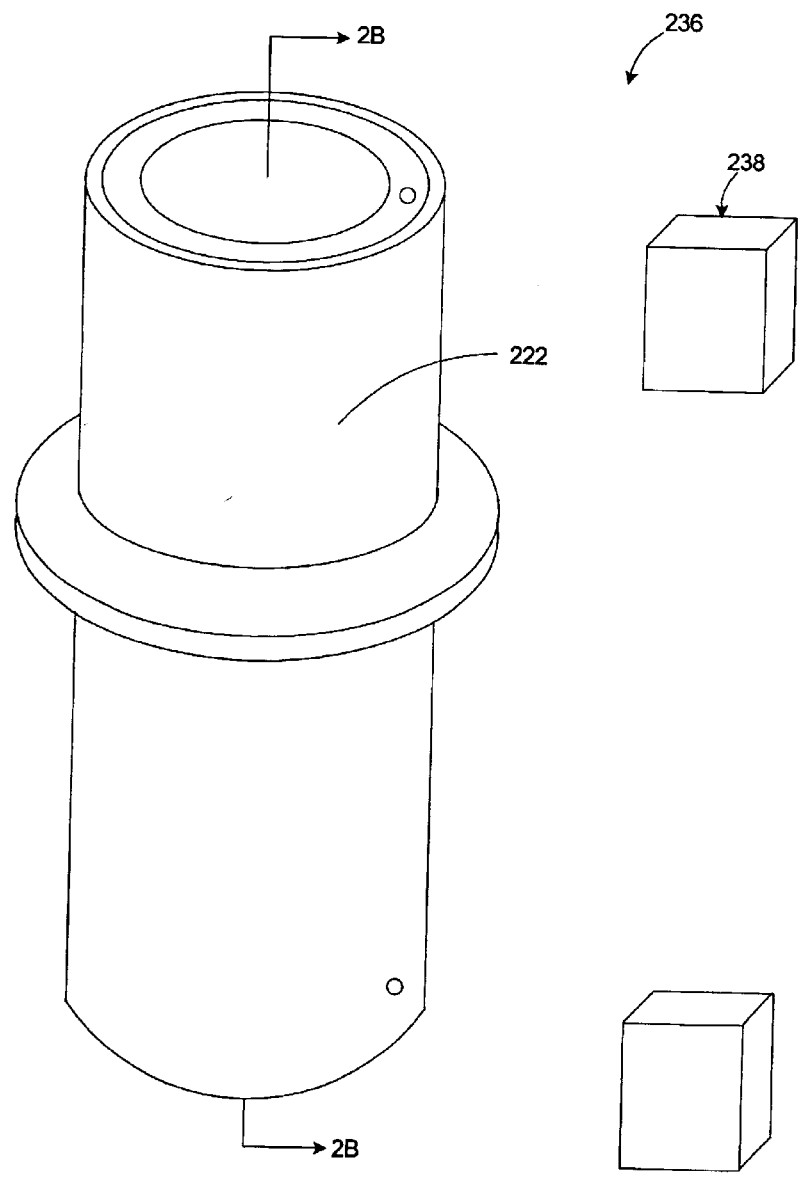
FIG. 2A is a perspective view of an optical assembly and a purging assembly having features of the present invention.

FIG. 2A is a perspective view of a combination 236 including an optical assembly 222 and a fluid purging assembly 238 that is useful as part of the exposure apparatus 10 (illustrated in FIG. 1). Alternately, the combination 236 can be used in other systems. The design of the optical assembly 222 can be varied according to its design requirements. For example, the optical assembly 222 can magnify or reduce an image from the reticle 12 (illustrated in FIG. 1). The optical assembly 222 need not be limited to a magnification or a reduction system. The optical assembly 222 could also be a 1× system.

Figure 2B:
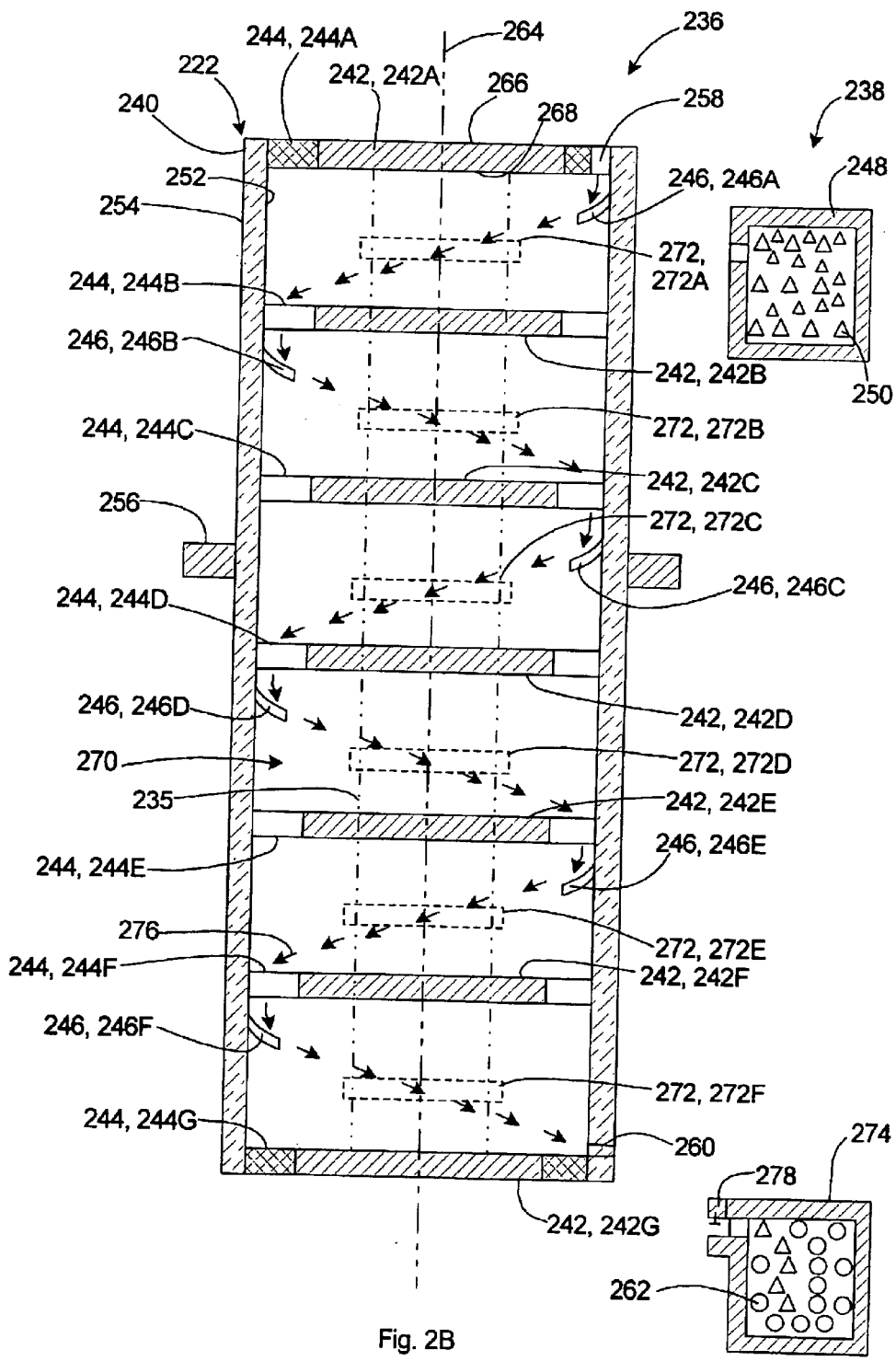
FIG. 2B is a cut-away view taken on line 2B—2B in FIG. 2A.

FIG. 2B is a cut-away view of the combination 236 of FIG. 2A. In FIG. 2B, the optical assembly 222 includes an optical housing 240, one or more optical elements 242, one or more element retainers 244 that secure the optical elements 242 to the optical housing 240 and one or more flow diverters 246. Further, the fluid purging assembly 238 includes a fluid source 248 that provides a replacement fluid 250 (illustrated as triangles) to the optical assembly 222. The design of each of these components can be varied to suit the design requirements of the optical assembly 222. Dashed lines 235 illustrate a representative example of the optical path that may be occupied by the light passing through the optical assembly 222.

In FIG. 2B, the optical housing 240 is substantially tubular or annular shaped and includes an inner wall 252 and an outer wall 254. The outer wall 254 includes an annular shaped support flange 256 for securing the optical assembly 222 to the apparatus frame 16 (illustrated in FIG. 1). Alternatively, for example, the optical housing 240 can include a plurality of support flanges 256 for securing the optical assembly 222 to the apparatus frame 16. In FIG. 2B, the optical housing 240 is illustrated as a unitary structure. Alternatively, the optical housing 240 can have a different shape or can be divided into a plurality of annular or arch shaped sections that are assembled together to facilitate assembly of the optical elements 242 to the optical housing 240.

Additionally, the optical housing 240 includes one or more inlet ports 258 and one or more outlet ports 260 that are in fluid communication with the fluid purging assembly 238 for purging the optical assembly 222. In FIG. 2B, the inlet port 258 extends through one of the element mounts 244 and the outlet port 260 extends through the optical housing 240. The number and exact location of the ports 258, 260 can be varied according to the design of the optical assembly 222. In FIG. 2B, the optical assembly 22 includes a single inlet port 258 positioned near the top of the optical housing 240 and a single outlet port 260 positioned near the bottom of the optical housing 240. Alternatively, the ports 258, 260 can be switched or the optical housing 240 can include a plurality of inlet ports 258 that are axially or radially spaced apart at strategic locations and a plurality of outlet ports 260 that are axially or radially spaced apart at strategic locations to maximize flow velocities and fluid mixing of the replacement fluid 250 with any unwanted fluid 262 (illustrated as circles) in the optical assembly 222. The outlet ports 260 are positioned to efficiently exhaust the unwanted fluid 262 from the optical assembly 222.

The ports 258, 260 can also designed and positioned to assist in creating and controlling the flow patterns of the replacement fluid 250 in the optical assembly 222. The size of each port 258, 260 can be varied. For example, each port 258, 260 has an inner diameter of between approximately 3 and 50 millimeters.

The number of optical elements 242 utilized and the design of each optical element 242 can be varied to suit the requirements of the optical assembly 222. In FIG. 2B, the optical assembly 222 includes seven, optical elements 242 that are spaced apart along an optical axis 264, namely a first optical element 242A, a second optical element 242B, a third optical element 242C, a fourth optical element 242D, a fifth optical element 242E, a sixth optical element 242F, and a seventh optical element 242G. Alternately, the optical assembly 222 can include more than seven or less than seven optical elements 242.

In FIG. 2B, each optical element 242 is generally disk shaped and includes a front surface 266 and an opposed rear surface 268. The figure of at least one of the surfaces 266, 268 of each optical element 242 is curved so that the light rays converge or diverge. In one embodiment, each optical element 242 is a refractive element. In this embodiment, each optical element 242 is made of a ground or molded substantially transparent material such as piece of glass or plastic. Alternatively, each optical element 242 can be a prism or a mirror.

Each optical element 242 can include one or more circulation channels (not shown) that extend through the optical element 242 for cooling. The circulation channels can be positioned so that a circulating fluid can be circulated relatively evenly throughout the optical element 242.

The element mounts 244 secure the optical elements 242 to the optical housing 240. The design and number of element mounts 244 can vary. In the embodiment illustrated in FIG. 2B, the optical assembly 222 includes seven element mounts 244 that are spaced apart along the optical axis 264, namely a first element mount 244A that secures and seals the first optical element 242A to the optical housing 240, a second element mount 244B that secures the second optical element 242B to the optical housing 240, a third element mount 244C that secures the third optical element 242C to the optical housing 240, a fourth element mount 244D that secures the fourth optical element 242D to the optical housing 240, a fifth element mount 244E that secures the fifth optical element 242E to the optical housing 240, a sixth element mount 244F that secures the sixth optical element 242F to the optical housing 240, and a seventh element mount 244G that secures and seals the seventh optical element 242G to the optical housing 240. Alternatively, the optical assembly 222 can include more than seven or less than seven element mounts 244.

The first element mount 244A is somewhat flat ring shaped and extends between the inner wall 252 of the optical housing 240 and the first optical element 242A. Further, the first element mount 244A encircles the first optical element 242A and seals the first optical element 242A to the optical housing 240. Somewhat similarly, the seventh element mount 244G is somewhat flat ring shaped and extends between the inner wall 252 of the optical housing 240 and the seventh optical element 242G. Further, the seventh element mount 244G encircles the seventh optical element 242G and seals the seventh optical element 242G to the optical housing 240.

In contrast, (i) the second element mount 244B includes a plurality of spaced apart, radially extending spokes that secure the second optical element 242B to the optical housing 240, (ii) the third element mount 244C includes a plurality of spaced apart, radially extending spokes that secure the third optical element 242C to the optical housing 240, (iii) the fourth element mount 244D includes a plurality of spaced apart, radially extending spokes that secure the fourth optical element 242D to the optical housing 240, (iv) the fifth element mount 244E includes a plurality of spaced apart, radially extending spokes that secure the fifth optical element 242F to the optical housing 240, and (v) the sixth element mount 244F that includes a plurality of spaced apart, radially extending spokes that secure the sixth optical element 242F to the optical housing 240. For example, each of the element mounts 244B–244F can include six spokes, more than six spokes or less than six spokes.

Each element mount 244 can be made of a number of materials including metal, plastic or other suitable material.

The optical housing 240, the optical elements 242, and the element mounts 244 cooperate to define one or more sealed optical cavities 270. In FIG. 2B, these elements cooperate to define a single optical cavity 270 that is substantially right, cylindrical shaped and has a circular shaped cross-section. However, other shapes are also possible.

Additionally, the optical assembly 222 can include one or more stagnant flow areas 272 (illustrated as a dashed box). Stagnant flow areas 272 experience low or non-existent flow during purging without the flow diverters 246. For example, in FIG. 2B, the optical assembly 222 can include a stagnant flow area 272 between each pair of adjacent optical elements 242. More specifically, the optical assembly 222 includes (i) a first stagnant flow area 272A between the first optical element 242A and the second optical element 242B, (ii) a second stagnant flow area 272B between the second optical element 242B and the third optical element 242C, (iii) a third stagnant flow area 272C between the third optical element 242C and the fourth optical element 242D, (iv) a fourth stagnant flow area 272D between the fourth optical element 242D and the fifth optical element 242E, (v) a fifth stagnant flow area 272E between the fifth optical element 242E and the sixth optical element 242F, and (vi) a sixth stagnant flow area 272F between the sixth optical element 242F and the seventh optical element 242G.

In FIG. 2B, each of the stagnant flow areas 272 is between a pair of adjacent optical elements 242. Alternatively, two or more stagnant flow areas 272 can be located between adjacent optical elements 242. Further, in FIG. 2B, each stagnant flow area 272 is substantially in the optical path 235. Alternatively, stagnant flow areas 272 can be anywhere in the optical cavity 270. For example, bolts or other structures can be the location of stagnant flow areas 272. Further, these stagnant flow areas 272 can be outside the optical path 235.

The one or more flow diverters 246 facilitate the efficient purging of the optical assembly 222 with the replacement fluid 250. More specifically, the flow diverters 246 divert and/or increase the flow of the replacement fluid 250 in the stagnant flow areas 272 to improve the flow of the replacement fluid 250 in the optical cavity 270 without increasing the overall flow of the replacement fluid 250 in the optical assembly 222.

The number of the flow diverters 246 can be varied depending upon the design of the optical assembly 222. For example, FIG. 2B illustrates that the optical assembly 222 includes six flow diverters 246, namely a first flow diverter 246A positioned between the first optical element 242A and second optical element 242B, a spaced apart second flow diverter 246B positioned between the second optical element 242B and the third optical element 242C, a spaced apart third flow diverter 246C positioned between the third optical element 242C and the fourth optical element 242D, a spaced apart fourth flow diverter 246D positioned between the fourth optical element 242D and the fifth optical element 242E, a fifth flow diverter 246E positioned between the fifth optical element 242E and the sixth optical element 242F, and a sixth flow diverter 246F positioned between the sixth optical element 242F and the seventh optical element 242G.

Alternatively, the optical assembly 222 can include more than six or less than six flow diverters 246.

In FIG. 2B, the flow diverters 246 are positioned outside the optical path 235 but in the flow path of the replacement fluid 250. Alternatively, the flow diverters 246 can be positioned within the optical path 235 during purging of the optical assembly 232 and moved by one or more actuators (not shown) out of the optical path 235 during processing of the wafer 14.

The design of each flow diverters 246 can be varied depending upon the design of the optical assembly 222. For example, one or more of the flow diverters 246 can include a vane, e.g. a deflector that redirects, deviates or bends the flow of the replacement fluid 250 in the optical cavity 270.

The fluid purging assembly 238 purges and replaces some or all of the unwanted fluid mixture 262 in the optical cavity 270 with the replacement fluid 250 until the level of unwanted fluid 262 in the optical cavity 270 is reduced to acceptable levels. The design of the fluid purging assembly 238 can be varied to suit the purging requirement of the optical assembly 222. In FIG. 2B, the fluid purging assembly 238 includes the fluid source 248 and a recovery system 274.

The fluid source 248 provides a source of pressurized replacement fluid 250 and directs the replacement fluid 250 into the inlet port(s) 258 for purging the optical cavity 270. The design of the fluid source 248 can be varied. For example, the fluid source 248 can be a pressurized container retaining the replacement fluid 250 that is in fluid communication with the inlet port(s) 258. Alternatively, for example, the fluid source 248 can include a fluid reservoir (not shown) and a fluid pump (not shown) that is in fluid communication with the inlet port(s) 258.

The fluid source 248 can include a manifold (not shown) that is in fluid communication with one or more of the inlet ports 258 and directs the replacement fluid 250 to the desired inlet port 258. Additionally, the fluid source 248 can include one or more fluid valves (not shown) that are controlled with the control system 26 (illustrated in FIG. 1) to control the flow rate of the replacement fluid 250 in the optical cavity 270. With this design, the control system 26 controls the opening and closing of each valve to create the desired flow of fluid in the optical cavity 270.

The type of replacement fluid 250 can vary according to the type of illumination system 18 (illustrated in FIG. 1) utilized. For example, the replacement fluid 250 can be a weakly absorbing gas or gas mixture to minimize absorption of light energy and localized heating within the optical assembly 222. Suitable replacement fluids 250 include inert gases such as helium, argon or neon. Inert gases, as examples, absorb far less radiation than fluids sought to be purged from the optical assembly 222 such as oxygen, water, carbon dioxide and other hydrocarbons. Nitrogen may also serve as the replacement fluid 250 for some radiation source wavelengths.

The recovery system 274 recovers and captures the unwanted gas mixture 262 that exhausts from the outlet ports 260 for recycling or proper handling. Alternately, the unwanted gas mixture 262 that exhausts from the outlet ports 260 can be released directly in the atmosphere.

FIG. 2B illustrates the flow 276 (represented by arrows) of at least a portion of the replacement fluid 256 in the optical cavity 270. More specifically, FIG. 2B illustrates that the flow diverters 246 are strategically located within the optical assembly 222 to redirect at least a portion of the replacement fluid 250 into the stagnant flow areas 272 and/or into the optical path 235. In particular, in FIG. 2B, (i) the replacement fluid 250 is released into the optical cavity 270 near the first optical element 242A, (ii) next, the first flow diverter 246A directs at least a portion of the replacement fluid 250 into the first stagnant flow area 272A, (iii) next, the second flow diverter 246B directs at least a portion of the replacement fluid 250 into the second stagnant flow area 272B, (iv) next, the third flow diverter 246C directs at least a portion of the replacement fluid 250 into the third stagnant flow area 272C, (v) next, the fourth flow diverter 246D directs at least a portion of the replacement fluid 250 into the fourth stagnant flow area 272D, (vi) next, the fifth flow diverter 246E directs at least a portion of the replacement fluid 250 into the fifth stagnant flow area 272E, (vii) next, the sixth flow diverter 246F directs at least a portion of the replacement fluid 250 into the sixth stagnant flow area 272F, and (viii) finally, the replacement fluid 250 is forced out the outlet port 260 and recovered by the recovery system 274.

It should be noted that in FIG. 2B, the flow diverters 246 cause flow 276 to be a somewhat serpentine shaped pattern in the optical cavity 270 around the optical elements 242. Alternatively, the flow diverters 246 can cause a different flow pattern.

The placement of the flow diverters 246 causes turbulence and improves mixing of the fluids in the optical cavity 270, reduces the time required to purge the optical assembly 222 and the amount of replacement fluid 250 used to dilute the unwanted fluid 262 in the optical cavity 270 to acceptable levels is minimized.

The fluid purging assembly 238 can also include a fluid analyzer 278 for detecting the composition of fluid exiting the optical cavity 270. The fluid analyzer 278 can discern whether unwanted gases 262 are present in amounts that may cause undesirable effects during use of the optical assembly 222. In one embodiment, the fluid analyzer 278 indicates when the percentage of oxygen, water vapor, carbon dioxide or other hydrocarbons, as examples, is acceptable or excessive. Stated another way, the fluid analyzer 278 can indicate when levels of the unwanted fluid 262 have decreased sufficiently to allow for proper functioning of the optical assembly 222. An acceptable level as provided herein can be approximately less than 10 parts per million (ppm), or approximately less than approximately one ppm, of the unwanted fluid 262. Examples of constituents of the unwanted fluid 262 which can cause undesirable effects include oxygen, water and water vapor, carbon dioxide, and other hydrocarbons. Thus, an acceptable level as provided herein may be approximately single digit, parts per million (ppm) residual oxygen level, residual water level, residual carbon dioxide level, or residual hydrocarbon level, although lower levels of the unwanted fluid 262 can be achieved with the present invention.

It should be noted that the fluid purging assembly 238 can continuously supply the replacement fluid 250 to the optical cavity 270. For example, the fluid source 248 can supply the replacement fluid 250 at between approximately 10 liters per minute to 30 liters per minute for between approximately 15 minutes to 60 minutes to initially purge the optical cavity 270. Further, the fluid source 248 can supply the replacement fluid 250 at between approximately ½ liter per minute to 10 liters per minute to continuously purge the optical cavity 270 to maintain the unwanted fluid 262 below the acceptable level.

Figure 2C:
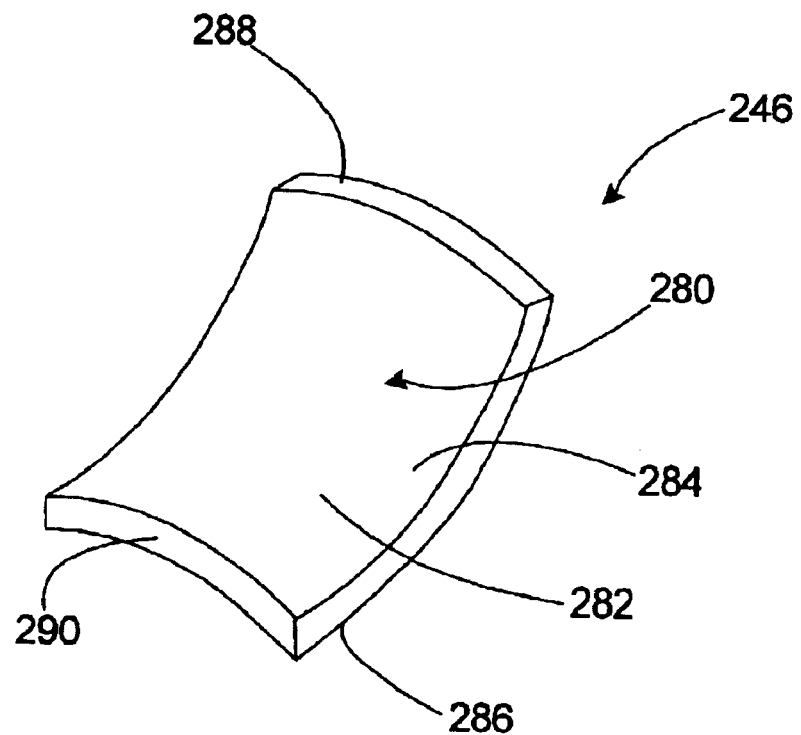
FIG. 2C is a perspective view of a flow diverter having features of the present invention.

FIG. 2C illustrates a perspective view of a vane 280 that can be used as a flow diverter 246 in the optical assembly 222 of FIG. 2B. In this embodiment, the vane 280 is a thin rigid, material that includes a curved surface 282 that redirects, bends and/or deviates the flow of the replacement fluid 250 (illustrated in FIG. 2B). More specifically, the vane 280 includes a front side 284 that is curved, a rear side 286 that is curved, a top surface 288 that is curved and has a radius that is approximately equal to the radius of the inner wall 252 of the optical housing 240 (illustrated in FIG. 2B), a bottom surface 290 that is curved and has a radius that is approximately equal to the radius of the inner wall 252 of the optical housing 240. The shape and dimensions of the curves can be varied to adjust the flow and to fit the optical housing 240.

However, the vane 280 can have an alternative shape and size. The vane 280 can be made of a number of materials. Suitable materials include metal, plastic, or a ceramic material. Further, each flow diverter 246 can include more than one vane 280 that is spaced apart circumferentially or along the optical axis 264 (illustrated in FIG. 2B).

Figure 3:
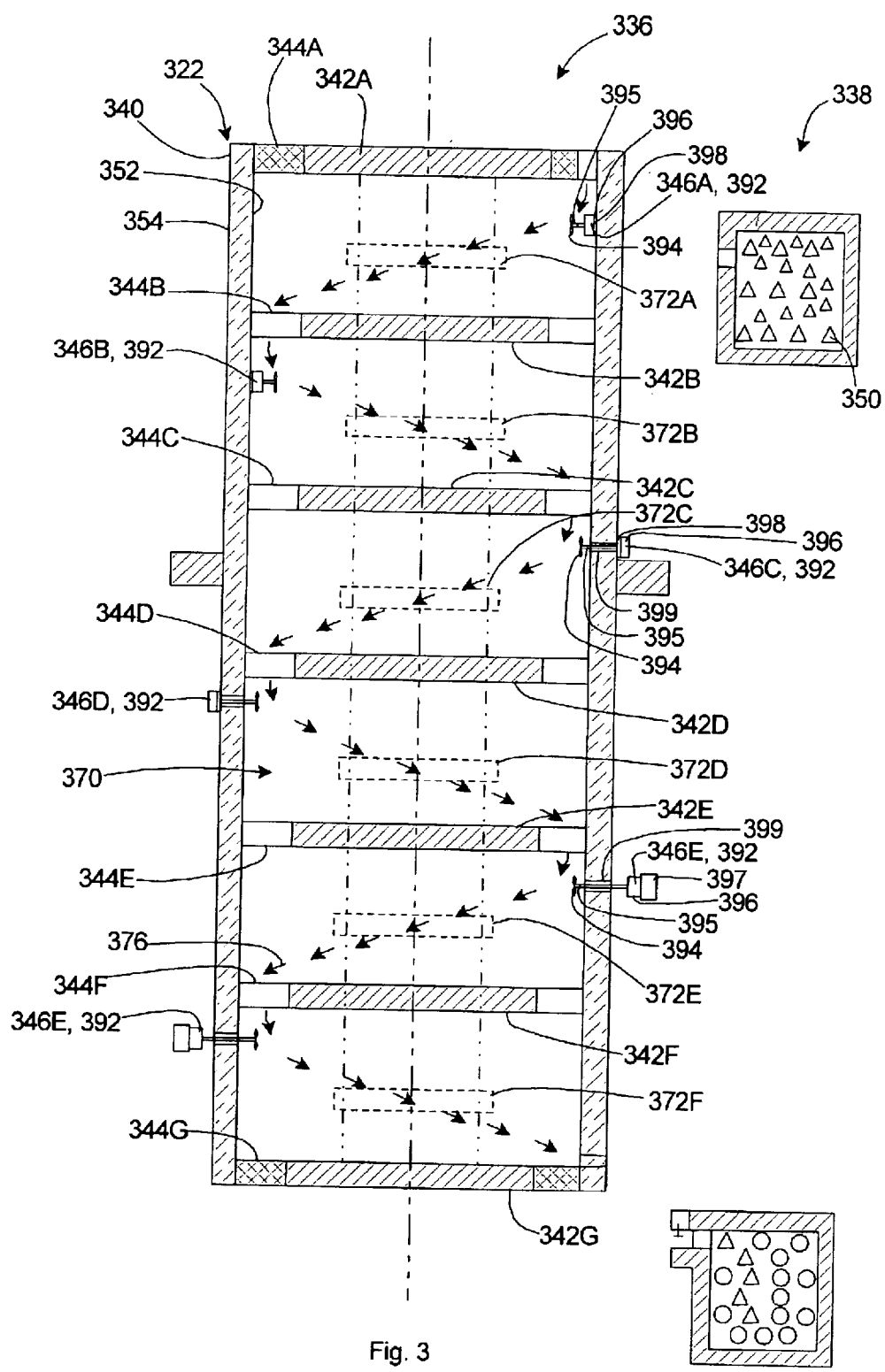
FIG. 3 is a cut away view of another embodiment of the optical assembly including a plurality of flow diverters.

FIG. 3 is a cross-sectional view of another embodiment of a combination 336 including an optical assembly 322 and a fluid purging assembly 338 that are somewhat similar to the corresponding components described above. The optical assembly 322 includes optical elements 342A–342G, element mounts 344A–344G, and flow diverters 346A–346F. Further, the optical assembly 322 includes stagnant flow areas 372A–372F. However, in this embodiment, each of the flow diverters 346A–346F is a fan 392 for directing flow into the stagnant flow areas 372A–372F.

The design of each fan 392 can vary. In FIG. 3, each fan 392 includes one or more thin rigid vanes 394, an output shaft 395 secured to the vanes 394, and an electric motor 396 that rotates the output shaft 395 and the vanes 394. The electric fans 392 can be positioned to push the replacement fluid 350 into the stagnant flow areas 372A–372F or draw replacement fluid 350 from the stagnant flow areas 372A–372F. In FIG. 3, each fan 392 directs the replacement fluid 350 into the stagnant flow area 372A–372F. Further, the fans 392 cause a back and forth flow pattern 376 in the optical cavity 370.

In FIG. 3, the flow diverters 346A–346F include three alternative type of fans 392. More specifically, for the first and second flow diverters 346A–346B, the entire fan 392 is positioned in the optical cavity 370 and the motor 396 is secured to the inner wall 352 of the optical housing 340 with a motor damper 398. The motor damper 398 inhibits and dampens the reaction forces generated by the motor 396 from being transferred to the optical housing 340 and the optical elements 342A–342G. The motor damper 398 can include a reaction mass assembly, a fluid cylinder, resilient material such as a viscoelastic material, or other type of vibration damping device. Alternatively, the motor 396 can be secured directly to the optical housing 340.

For the third and fourth flow diverters 346C–346D, for each fan 392, the vanes 394 are positioned in the optical cavity 370, the output shaft 395 extends through the optical housing 340, a seal 399 seals the output shaft 395 to the optical housing 340, the motor 396 is positioned outside the optical cavity 370, and the motor 396 is secured to the outer wall 354 of the optical housing 340 with the motor damper 398. The motor damper 398 inhibits and dampens the reaction forces generated by the motor 396 from being transferred to the optical housing 340 and the optical elements 342A–342G. With the motor 396 positioned outside the optical cavity 370, the heat generated by the motor 396 is not directly transferred to the optical cavity 370.

For the fifth and sixth flow diverters 346E–346F, for each fan 392, the vanes 394 are positioned in the optical cavity 370, the output shaft 395 extends through the optical housing 340, a seal 399 seals the output shaft 395 to the optical housing 340, the motor 396 is positioned outside the optical cavity 370, and the motor 396 is secured to another structure 397 that is isolated from the optical housing 340. With this design, reaction forces generated by the motor 396 are not directly transferred to the optical housing 340 and the optical elements 342A–342G. With the motor 396 positioned outside the optical cavity 370, the heat generated by the motor 396 is not directly transferred to the optical cavity 370.

The amount of amount of flow for the fan 392 can be varied. For example, each fan 392 can generate a flow of at least approximately 0.1 liters per minute, 1 liter per minute or 10 liters per minute.

One or more of the electric fans 392 could be turned off and on at certain times so that possible vibration from the fans 392 does not influence the performance of the optical assembly 322. For example, the electrical fans 392 can be turned on during the purging of the optical assembly 322 and turned off during processing of the wafer 14 (illustrated in FIG. 1).

Figure 4A:
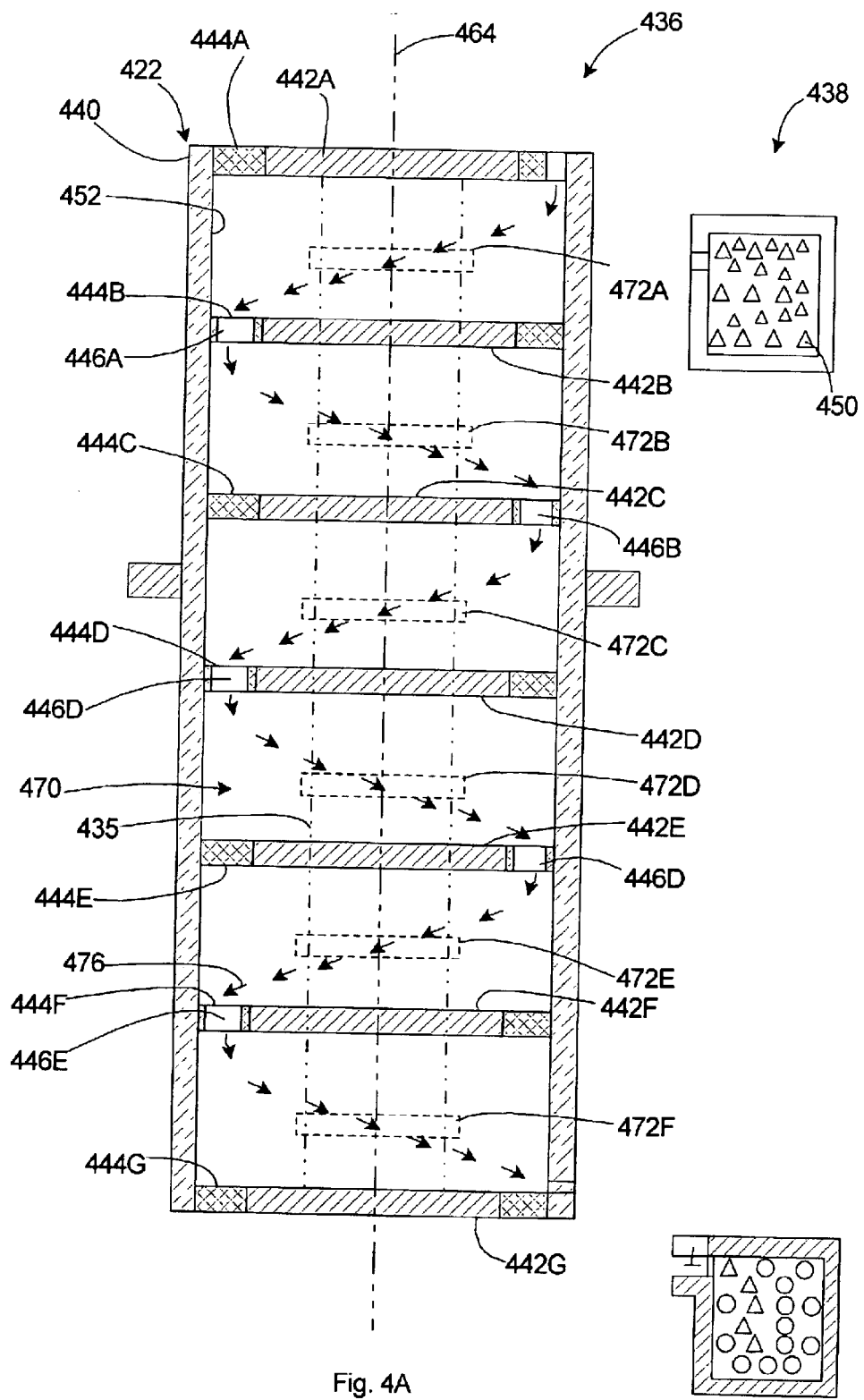
FIG. 4A is a cut view of still another embodiment of the optical assembly including a plurality of flow diverters.

FIG. 4A is a cross-sectional view of another embodiment of a combination 436 including an optical assembly 422 and a fluid purging assembly 438 that are somewhat similar to the corresponding components described above. In this embodiment, the optical assembly 422 includes optical elements 442A–442G, element mounts 444A–444G, and flow diverters 446A–446E. Further, the optical assembly 422 includes stagnant flow areas 472A–472F. However, in this embodiment, each of the flow diverters 446A–446F is integrated into the element mounts 444B–444F. Further, the flow diverters 446A–446E direct the replacement fluid 450 into the stagnant flow areas 472A–472F and/or through the optical path 435.

Figure 4B:
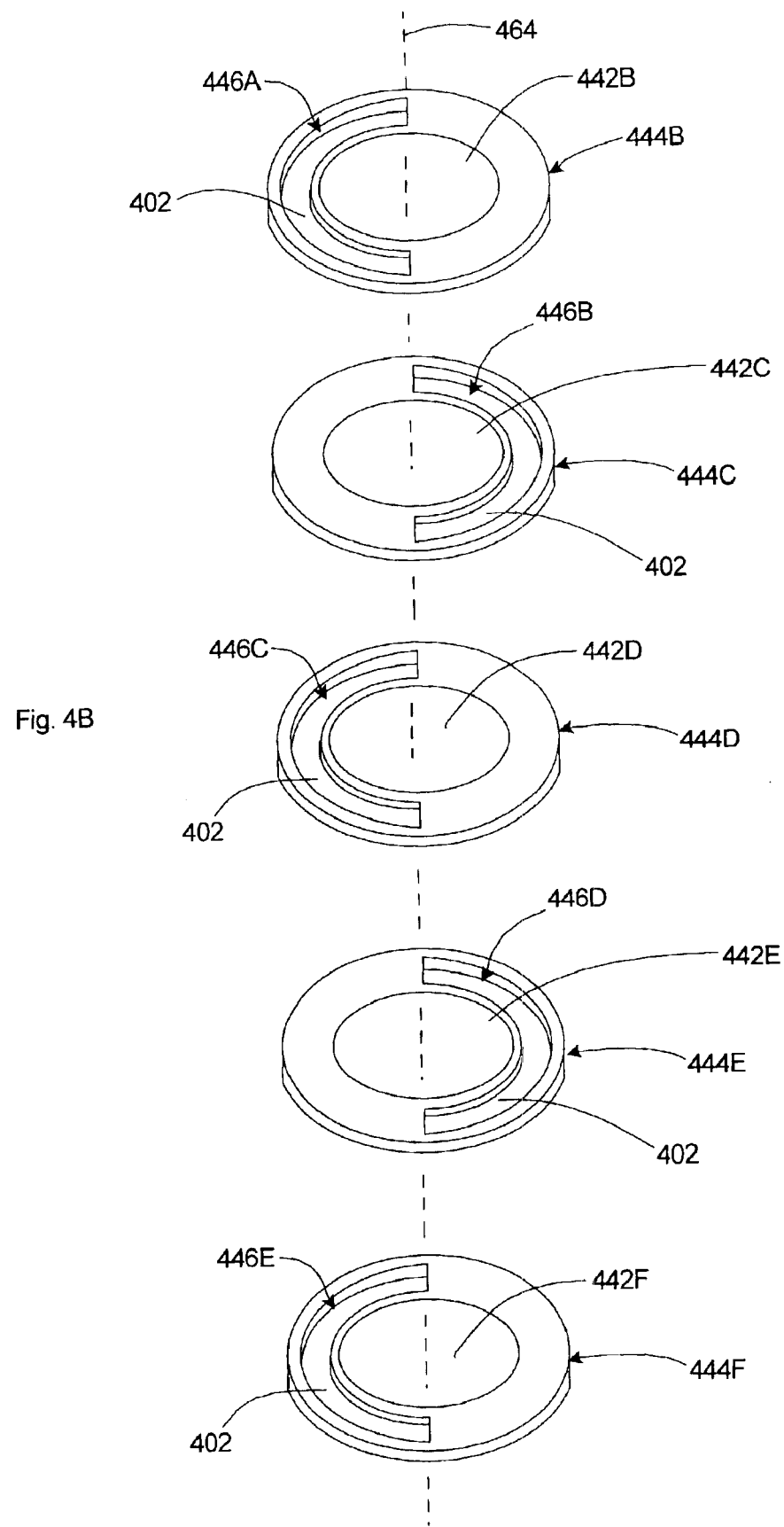
FIG. 4B is a perspective view of five of the flow diverters of FIG. 4A.

FIG. 4B illustrates a perspective view of (i) the second element mount 444B and second element 442B, (ii) the third element mount 444C and the third optical element 442C, (iii) the fourth element mount 444D and fourth element 442D, (iv) the fifth element mount 444E and fifth element 442E, and (v) the sixth element mount 444F and the sixth element 442F spaced apart along the optical axis 464. In this embodiment, the fourth and sixth element mounts 444D, 444F are similar to the second element mount 444B and the fifth element mount 444E is similar to the third element mount 444C. Alternatively, each of the element mounts 444B–444F can be different.

In this embodiment, the second element mount 444B is generally flat ring shaped and extends between the inner wall 452 of the optical housing 440 (illustrated in FIG. 4A) and the second optical element 442A. Further, the second element mount 444B encircles the second optical element 442A. However, in this embodiment, the second element mount 444B includes one or more mount apertures 402 that extend through the second element mount 444B. In FIG. 4B, the second element mount 444B includes one arch shaped mount aperture 402 that is positioned on the left side of the optical axis 464. In FIG. 4B, the fourth element mount 444D and the sixth element mount 444F have a similar design.

Further, the third element mount 444C is generally flat ring shaped and extends between the inner wall 452 of the optical housing 440 (illustrated in FIG. 4A) and the third optical element 442C. Further, the third element mount 444C encircles the third optical element 442C. However, in this embodiment, the third element mount 444C includes one or more mount apertures 402 that extend through the third element mount 444C. In FIG. 4B, the third element mount 444C includes one arch shaped mount aperture 402 that is positioned on the right side of the optical axis 464. In FIG. 4B, the fifth element mount 444E has a similar design.

In this embodiment, the mount apertures 402 of adjacent element mounts are positioned on opposite sides of the optical axis 464. Alternatively, the mount apertures 402 can be offset approximately 90 degrees or 120 degrees.

In this embodiment, the second element mount 444B defines the first flow deflector 446A, the third element count 444C defines the second flow deflector 446B, the fourth element mount 444D defines the third flow deflector 446C, the fifth element mount 444E defines the fourth flow deflector 446D, and the sixth element mount 444F defines the fifth flow deflector 446E. The flow diverters cause a substantially serpentine shaped flow 476 pattern of the replacement fluid in the optical cavity that winds between the optical elements.

Each element mount 444A–444G can be made of a number of materials including metal, plastic, or other suitable materials.

Figure 5:
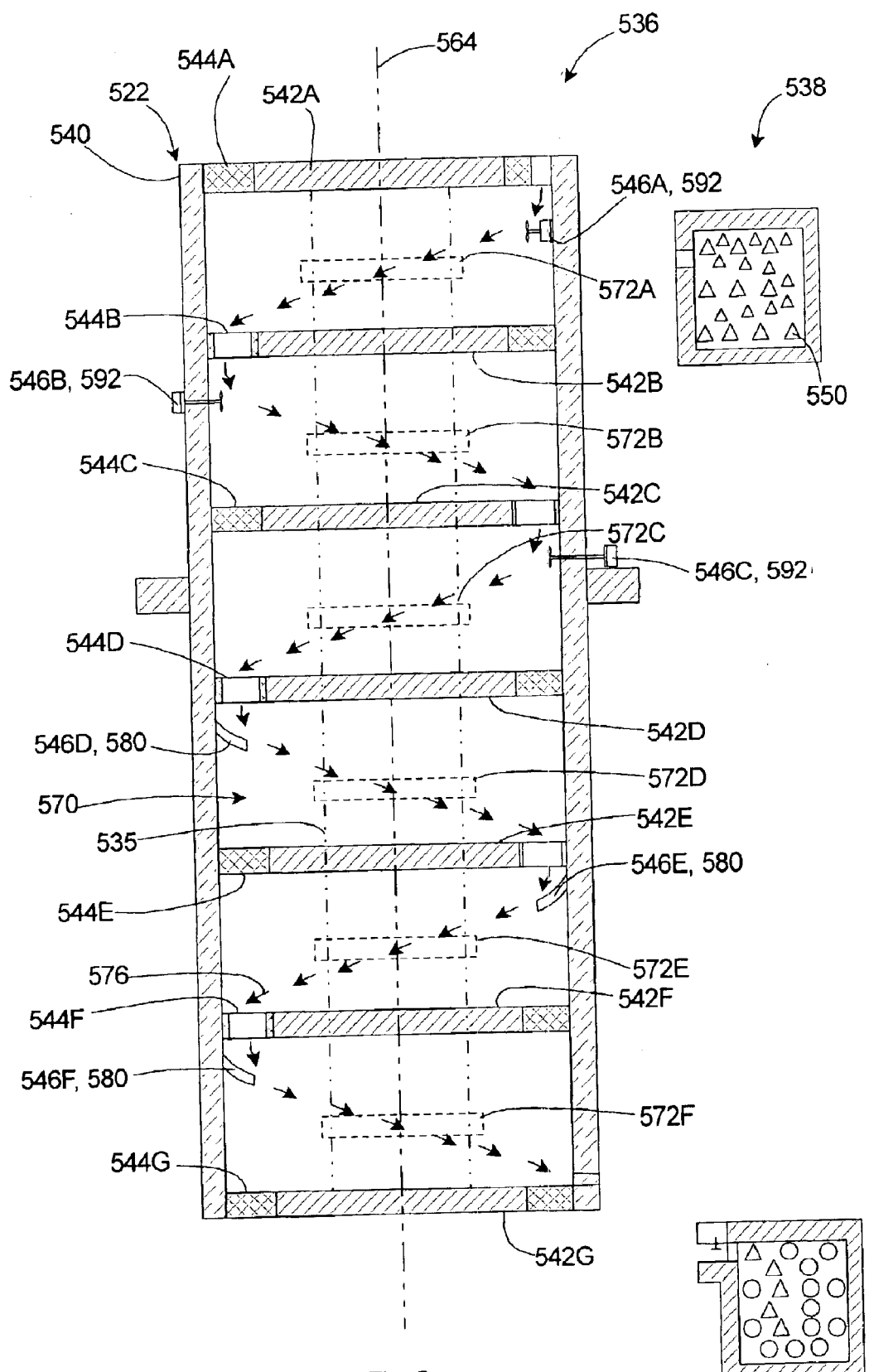
FIG. 5 is a cut away view of yet another embodiment of the optical assembly including a plurality of flow diverters.

FIG. 5 is a cross-sectional view of another embodiment of a combination 536 including an optical assembly 522 and a fluid purging assembly 538 that are somewhat similar to the corresponding components described above. In this embodiment, the optical assembly 522 includes optical elements 542A–542G, element mounts 544A–544G, and flow diverters 546A–546F. Further, the optical assembly 522 includes stagnant flow areas 572A–572F. However, in this embodiment, the flow diverters 546A–546F include three vanes 580 that are similar to the vanes 280 illustrated in FIG. 2B, three fans 592 similar to the fans 392 illustrated in FIG. 3, and the element mounts 544A–544G with integrated flow diverters that are similar to the element mounts 444A–444G illustrated in FIGS. 4A and 4B. Alternatively, the optical assembly 522 can be designed with more or less flow diverters.

Figure 6A:
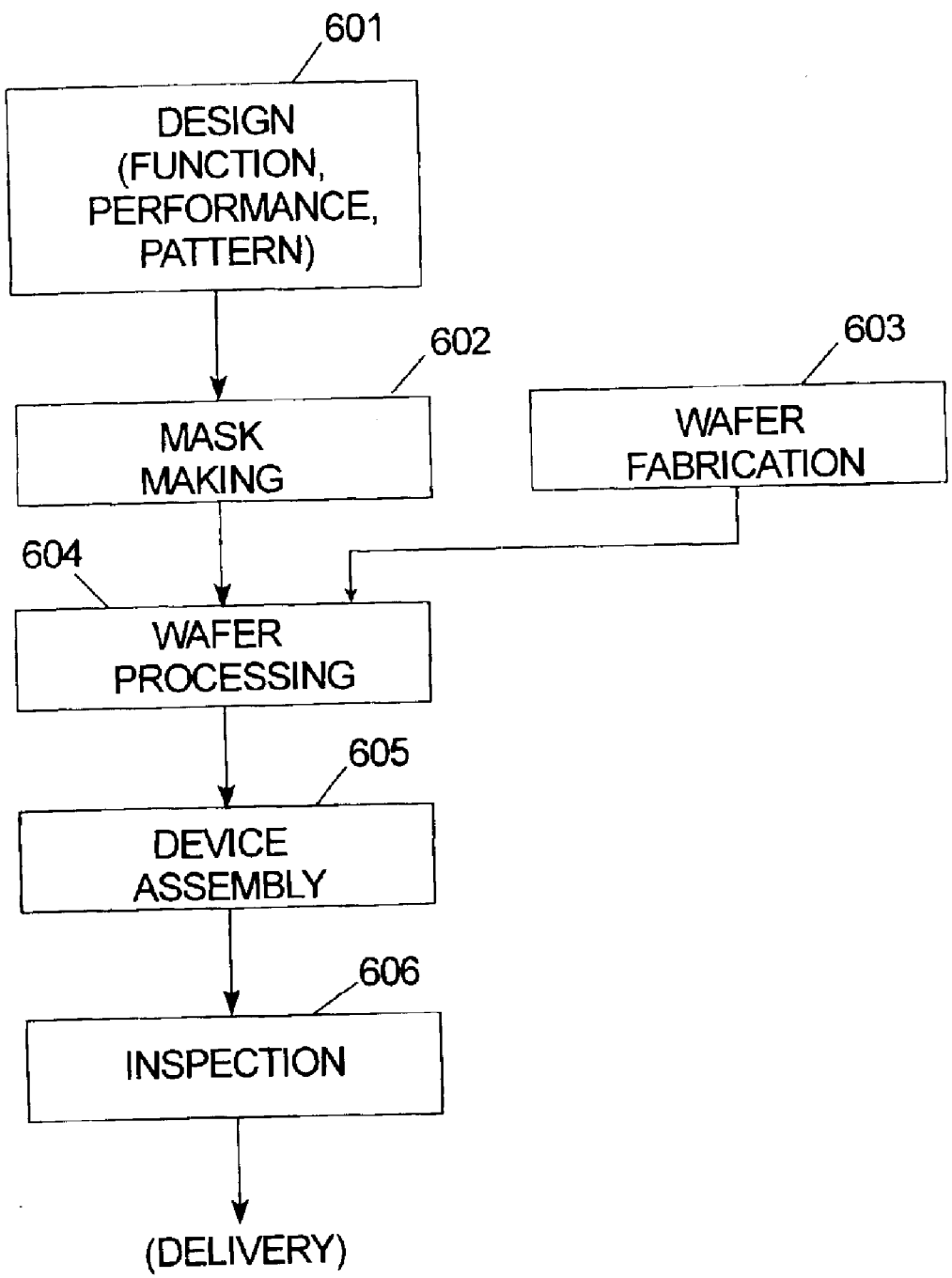
FIG. 6A is a flow chart that outlines a process for manufacturing a device in accordance with the present invention.

Semiconductor devices can be fabricated using the above described systems, by the process shown generally in FIG. 6A. In step 601 the device's function and performance characteristics are designed. Next, in step 602, a mask (reticle) having a pattern is designed according to the previous designing step, and in a parallel step 603 a wafer is made from a silicon material. The mask pattern designed in step 602 is exposed onto the wafer from step 603 in step 604 by a photolithography system described hereinabove in accordance with the present invention. In step 605 the semiconductor device is assembled (including the dicing process, bonding process and packaging process), finally, the device is then inspected in step 606.

Figure 6B:
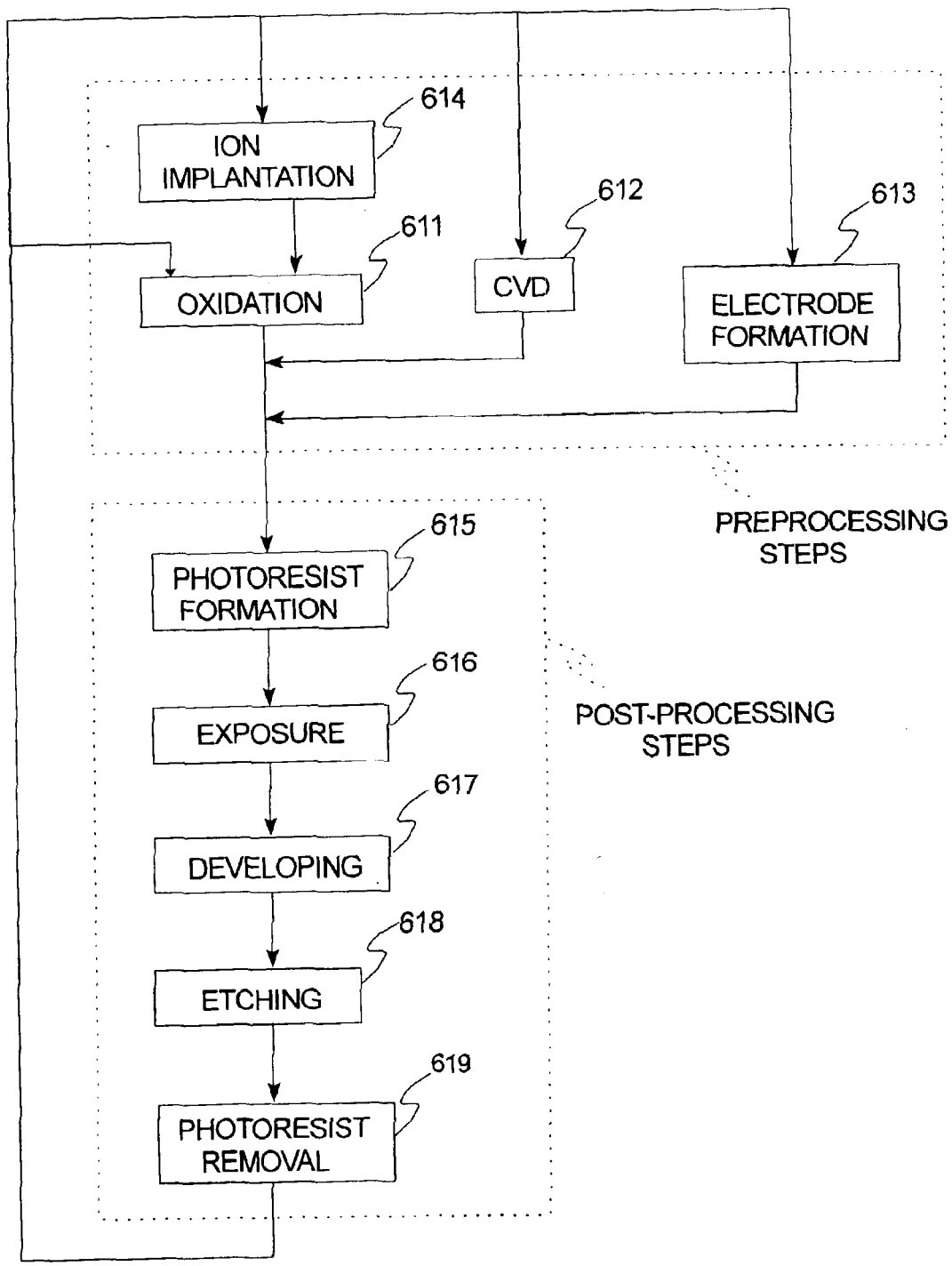
FIG. 6B is a flow chart that outlines device processing in more detail.

FIG. 6B illustrates a detailed flowchart example of the above-mentioned step 604 in the case of fabricating semiconductor devices. In FIG. 6B, in step 611 (oxidation step), the wafer surface is oxidized. In step 612 (CVD step), an insulation film is formed on the wafer surface. In step 613 (electrode formation step), electrodes are formed on the wafer by vapor deposition. In step 614 (ion implantation step), ions are implanted in the wafer. The above mentioned steps 611–614 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 615 (photoresist formation step), photoresist is applied to a wafer. Next, in step 616 (exposure step), the above-mentioned exposure device is used to transfer the circuit pattern of a mask (reticle) to a wafer. Then in step 617 (developing step), the exposed wafer is developed, and in step 618 (etching step), parts other than residual photoresist (exposed material surface) are removed by etching. In step 619 (photoresist removal step), unnecessary photoresist remaining after etching is removed.

Multiple circuit patterns are formed by repetition of these preprocessing and post-processing steps.

While the particular adjuster assembly as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. An optical assembly for directing a beam of light, the optical assembly for use with a replacement fluid from a fluid source, the optical assembly comprising:

an optical housing that defines an optical cavity, the optical housing including an inlet port that is in fluid communication with the fluid source so that the replacement fluid from the fluid source is directed into the optical cavity and flows in the optical cavity, the optical cavity including a stagnant flow area;

an optical element secured to the optical housing;

a first fluid passage provided in the optical cavity and allowing the replacement fluid to flow from a first Portion of the optical cavity on one side of the optical element to a second portion of the optical cavity on another side of the optical element; and a flow diverter positioned in the optical cavity, the flow diverter redirecting the flow of the replacement fluid in the optical cavity so that the replacement fluid flows into the stagnant flow area.

2. The optical assembly of claim 1 including a plurality of spaced apart flow diverters positioned within the optical cavity, each flow diverter diverting the flow of replacement fluid in the optical cavity.

3. The optical assembly of claim 1 wherein the flow diverter is a vane positioned in the optical cavity that causes the flow of the replacement fluid in the optical cavity to flow into the first stagnant flow area.

4. The optical assembly of claim 1 wherein the flow diverter is a fan that causes the replacement fluid in the optical cavity to flow into the stagnant flow area.

5. The optical assembly of claim 4 wherein the fan pulls the replacement fluid into the stagnant flow area.

6. The optical assembly of claim 4 wherein the fan pushes the replacement fluid into the stagnant flow area.

7. The optical assembly of claim 1 further comprising an element mount that is generally annular ring shaped and the element mount includes the first fluid passage.

8. The optical assembly of claim 1 further comprising a first element mount and a second element mount that are spaced apart along an optical axis, wherein the first element mount includes the first fluid passage and the second element mount includes a second fluid passage, and wherein the first fluid passage is substantially opposite relative to the optical axis from the second fluid passage.

9. The optical assembly of claim 8 wherein the first element mount and the second element mount cause a somewhat serpentine shaped flow pattern in at least a portion of the optical cavity.

10. The optical assembly of claim 1 wherein the optical cavity includes a plurality of spaced apart stagnant flow areas and the optical assembly includes a plurality of spaced apart flow diverters positioned in the optical cavity, each flow diverter redirecting the flow of the replacement fluid in the optical cavity so that the replacement fluid flows into each stagnant flow area.

11. An exposure apparatus including an illumination source and the optical assembly of claim 1 positioned near the illumination source.

12. A device manufactured with the apparatus according to claim 11.

13. A wafer on which an image has been formed by the apparatus of claim 11.

14. A method for purging an optical cavity of an optical assembly, the optical assembly including an optical element and a stagnant flow area, the method comprising the steps of:

providing a fluid source of a replacement fluid;

directing the replacement fluid into the optical cavity;

providing a fluid passage to allow the replacement fluid to flow from a first portion of the optical cavity on one side of the optical element to a second portion of the optical cavity on another side of the optical element; and redirecting the flow of the replacement fluid into the stagnant flow area of the optical cavity with a flow diverter positioned in the optical cavity.

15. The method of claim 14 wherein the step of redirecting includes redirecting the flow of replacement fluid with a plurality of spaced apart flow diverters positioned within the optical cavity.

16. The method of claim 14 wherein the flow diverter is a vane positioned in the optical cavity that causes the flow of the replacement fluid in the optical cavity to flow into the stagnant flow area.

17. The method of claim 14 wherein the flow diverter is a fan that causes the replacement fluid in the optical cavity to flow into the stagnant flow area.

18. The method of claim 14 further comprising the step of securing the optical element to an optical housing with an element mount and wherein the fluid passage is integrated into the element mount.

19. The method of claim 14 wherein the optical cavity includes a plurality of spaced apart stagnant flow areas and the step of redirecting includes the step of redirecting the flow of the replacement fluid with a plurality of spaced apart flow diverters in the optical cavity so that the replacement fluid flows into each stagnant flow area.

20. A method for making an exposure apparatus for transferring an image from a reticle to a wafer, the method comprising the steps of:

providing an illumination system that directs an illumination beam at the reticle; and providing an optical assembly that is purged by the method of claim 14.

21. A method for making an object including at least the photolithography process, wherein the photolithography process transfers an image onto the object utilizing the apparatus made by the method of claim 20.

22. A method of making a wafer utilizing the apparatus made by the method of claim 20 to transfer an image onto the wafer.

23. A method for making an optical assembly for directing a beam of light, the optical assembly for use with a replacement fluid from a fluid source, the method comprising the steps of:

providing an optical housing that defines an optical cavity, the optical cavity including a stagnant flow area;

securing an optical element to the optical housing;

directing a replacement fluid from a fluid source into the optical cavity;

providing a fluid passage to allow the replacement fluid to flow from a first portion of the optical cavity on one side of the optical element to a second portion of the optical cavity on another side of the optical element; and redirecting the replacement fluid into the stagnant flow area with a fluid diverter positioned within the optical cavity.

24. The method of claim 23 wherein the step of redirecting includes redirecting the flow of replacement fluid with a plurality of spaced apart flow diverters positioned within the optical cavity.

25. The method of claim 23 wherein the flow diverter is a vane positioned in the optical cavity that causes the flow of the replacement fluid in the optical cavity to flow into the stagnant flow area.

26. The method of claim 23 wherein the flow diverter is a fan that causes the replacement fluid in the optical cavity to flow into the stagnant flow area.

27. The method of claim 23 further comprising the step of securing the optical element to the optical housing with an element mount and wherein the fluid passage is integrated into the element mount.

28. The method of claim 23 wherein the optical cavity includes a plurality of spaced apart stagnant flow areas and the step of redirecting includes the step of redirecting the flow of the replacement fluid with a plurality of spaced apart flow diverters in the optical cavity so that the replacement fluid flows into each stagnant flow area.

29. A method for making an exposure apparatus for transferring an image from a reticle to a wafer, the method comprising the steps of:

providing an illumination system that directs an illumination beam at the reticle; and providing an optical assembly made by the method of claim 23.

30. A method for making an object including at least the photolithography process, wherein the photolithography process transfers an image onto the object utilizing the apparatus made by the method of claim 29.

31. A method of making a wafer utilizing the apparatus made by the method of claim 29 to transfer an image onto the wafer.

32. An optical assembly for directing a beam of light, the optical assembly for use with a replacement fluid from a fluid source, the optical assembly comprising:

an optical housing that defines an optical cavity, the optical housing including an inlet port that is in fluid communication with the fluid source so that the replacement fluid from the fluid source is directed into the optical cavity and flows in the optical cavity, the optical cavity including a stagnant flow area;

an optical element secured to the optical housing; and a flow diverter positioned in the optical cavity, wherein the flow diverter is a vane that redirects the flow of the replacement fluid in the optical cavity so that the replacement fluid flows into the stagnant flow area.

33. A method for purging an optical cavity of an optical assembly, the optical assembly including an optical element and a stagnant flow area, the method comprising the steps of:

providing a fluid source of a replacement fluid;

directing the replacement fluid into the optical cavity; and redirecting the flow of the replacement fluid into the stagnant flow area of the optical cavity with a flow diverter positioned in the optical cavity, wherein the flow diverter is a vane that causes the flow of the replacement fluid in the optical cavity to flow into the stagnant flow area.

34. A method for making an optical assembly for directing a beam of light, the optical assembly for use with a replacement fluid from a fluid source, the method comprising the steps of:

providing an optical housing that defines an optical cavity, the optical cavity including a stagnant flow area;

securing an optical element to the optical housing;

directing a replacement fluid from a fluid source into the optical cavity; and redirecting the replacement fluid into the stagnant flow area with a fluid diverter positioned within the optical cavity, wherein the flow diverter is a vane that causes the flow of the replacement fluid in the optical cavity to flow into the stagnant flow area.

35. An optical assembly for directing a beam of light, the optical assembly for use with a replacement fluid from a fluid source, the optical assembly comprising:

an optical housing that defines an optical cavity, the optical housing including an inlet port that is in fluid communication with the fluid source so that the replacement fluid from the fluid source is directed into the optical cavity and flows in the optical cavity;

a first optical element; and a first element mount that secures the first optical element to the optical housing, the first element mount including a first fluid passage that allows the replacement fluid to flow from a first portion of the optical cavity on one side of the first optical element to a second portion of the optical cavity on another side of the first optical element, the first fluid passage being substantially arch shaped.

36. The optical assembly of claim 35 further comprising a second optical element that is spaced apart from the first element mount along an optical axis, and a second element mount that secures the second optical element to the optical housing, the second element mount including a second fluid passage that allows the replacement fluid to flow from a first side of the second optical element to a second side of the first optical element, the second fluid passage being substantially arch shaped.

37. The optical assembly of claim 36 wherein the first fluid passage is substantially opposite relative to the optical axis from the second fluid passage.

38. The optical assembly of claim 36 wherein the first element mount and the second element mount cause a somewhat serpentine shaped flow pattern in at least a portion of the optical cavity.

* * * * *

UNITED STATES PATENT AND TRADEMARK OFFICE
CERTIFICATE OF CORRECTION

PATENT NO. : 6,847,431 B2 Page 1 of 1
DATED : January 25, 2005
INVENTOR(S) : Coon et al.

It is certified that error appears in the above-identified patent and that said Letters Patent is hereby corrected as shown below:

Column 14,
Line 67, please delete the word "Portion" and substitute therefore -- portion --.

Column 15,
Line 14, please delete the word "first".

Signed and Sealed this

Thirty-first Day of May, 2005

JON W. DUDAS
*Director of the United States Patent and Trademark Office*